(12) United States Patent
Chang et al.

(10) Patent No.: US 12,252,776 B2
(45) Date of Patent: Mar. 18, 2025

(54) CARRYING DEVICE AND SEMICONDUCTOR PROCESSING APPARATUS

(71) Applicant: BEIJING NAURA MICROELECTRONICS EQUIPMENT CO., LTD., Beijing (CN)

(72) Inventors: Qing Chang, Beijing (CN); Bing Li, Beijing (CN); Mengxin Zhao, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 647 days.

(21) Appl. No.: 16/619,651

(22) PCT Filed: May 15, 2018

(86) PCT No.: PCT/CN2018/086851
§ 371 (c)(1),
(2) Date: Dec. 5, 2019

(87) PCT Pub. No.: WO2018/223820
PCT Pub. Date: Dec. 13, 2018

(65) Prior Publication Data
US 2020/0095671 A1   Mar. 26, 2020

(30) Foreign Application Priority Data
Jun. 5, 2017 (CN) .......................... 201710413268.1

(51) Int. Cl.
C23C 14/54 (2006.01)
C23C 14/50 (2006.01)
H01L 21/673 (2006.01)

(52) U.S. Cl.
CPC ............ *C23C 14/541* (2013.01); *C23C 14/50* (2013.01); *H01L 21/67366* (2013.01); *H01L 21/67383* (2013.01); *H01L 21/67393* (2013.01)

(58) Field of Classification Search
None
See application file for complete search history.

(56) References Cited

U.S. PATENT DOCUMENTS 7,815,740 B2 * 10/2010 Oohashi ............ H01J 37/32724
                                                118/724
9,668,373 B2 *  5/2017 West ................... H01L 21/6833
(Continued)

FOREIGN PATENT DOCUMENTS

CN    102468208 A    5/2012
CN    203232859 U   10/2013
(Continued)

OTHER PUBLICATIONS

Metals, Metallic Elements and Alloys—2022 Thermal Conductivities https://www.engineeringtoolbox.com/thermal-conductivity-metals-d_858.html Accessed May 21, 2022 (Year: 2022).*
(Continued)

*Primary Examiner* — Parviz Hassanzadeh
*Assistant Examiner* — Tiffany Z Nuckols
(74) *Attorney, Agent, or Firm* — ANOVA LAW GROUP, PLLC

(57) ABSTRACT

The present disclosure provides a carrying device and a semiconductor processing apparatus. The carrying device includes a heating plate and a cooling plate, the heating plate and the cooling plate are spaced apart, and a thermal insulation region is formed between the heating plate and the cooling plate. The carrying device of the present disclosure not only can preempt the need to stop the process due to (Continued)

excessively high temperature, but also can maintain a uniform and stable temperature throughout the process, thereby providing a qualified and stable processing temperature for a workpiece to be processed, and eventually obtaining better processing results.

12 Claims, 6 Drawing Sheets

(56) References Cited

U.S. PATENT DOCUMENTS

| | | | | |
|---|---|---|---|---|
| 10,008,404 B2* | 6/2018 | Parkhe | ............. | H01L 21/68785 |
| 10,515,786 B2* | 12/2019 | Koiwa | ............. | H01J 37/32724 |
| 2002/0129475 A1* | 9/2002 | Tsai | ................... | C23C 16/4586 |
| | | | | 29/25.01 |
| 2004/0099635 A1* | 5/2004 | Nishikawa | ........ | H01L 21/67017 |
| | | | | 216/58 |
| 2004/0187787 A1* | 9/2004 | Dawson | ............ | H01L 21/67248 |
| | | | | 118/728 |
| 2006/0112880 A1* | 6/2006 | Iwabuchi | .......... | H01L 21/67109 |
| | | | | 118/724 |
| 2007/0090520 A1 | 4/2007 | Choi et al. | | |
| 2009/0159588 A1* | 6/2009 | Morioka | ........... | H01L 21/67103 |
| | | | | 219/444.1 |
| 2010/0039747 A1* | 2/2010 | Sansoni | ............ | H01L 21/67103 |
| | | | | 361/234 |
| 2012/0055403 A1* | 3/2012 | Gomi | .................. | C23C 16/4404 |
| | | | | 118/725 |
| 2012/0285658 A1* | 11/2012 | Roy | .................. | H01L 21/68785 |
| | | | | 165/47 |
| 2013/0026722 A1* | 1/2013 | McRay | ............. | H01L 21/68792 |
| | | | | 279/157 |
| 2013/0286533 A1* | 10/2013 | Takasaki | ............. | H01L 21/6831 |
| | | | | 361/234 |
| 2014/0356985 A1* | 12/2014 | Ricci | ................... | C23C 16/4586 |
| | | | | 118/712 |
| 2017/0278737 A1* | 9/2017 | Koiwa | ................ | H01L 21/6833 |

FOREIGN PATENT DOCUMENTS

| | | |
|---|---|---|
| CN | 203839351 U | 9/2014 |
| CN | 206907749 U | 1/2018 |
| CN | 105489527 B | 11/2018 |
| TW | 201423904 A | 6/2014 |
| TW | 201606919 A | 2/2016 |
| TW | 201635424 A | 10/2016 |

OTHER PUBLICATIONS

World Intellectual Property Organization (WIPO) International Search Report and Written Opinion for PCT/CN2018/086851 Jul. 18, 2018 6 Pages.

* cited by examiner

CARRYING DEVICE AND SEMICONDUCTOR PROCESSING APPARATUS

This application is a National Stage entry under § 371 of International Application No. PCT/CN2018/086851, filed on May 15, 2018, and claims priority to Chinese Patent Application No. 201710413268.1, filed on Jun. 5, 2017, the entire contents of which are hereby incorporated as reference.

TECHNICAL FIELD

The present disclosure relates to the field of semiconductor processing, and more particularly relates to a carrying device and a semiconductor processing apparatus.

BACKGROUND TECHNOLOGY

As the semiconductor industry continues to evolve, semiconductor manufacturing processes are becoming more diverse. Regardless of the process, temperature is an extremely important factor that directly affects equipment costs and capacity.

Generally, when processing a semiconductor, the wafer needs to be placed on a carrying device of the semiconductor processing equipment and be heated to the processing temperature through the heating function of the carrying device, and the processing temperature is maintained during the process.

In operation, it is difficult to achieve effective control of the temperature of the carrying device due to the influence of the processing gas and the process steps. For example, in a physical vapor deposition (PVD) process, ions of a target are deposited onto a wafer by a sputter deposition technique. Because the temperature of the metal ions sputtered from the target is high, the heat of the metal ions deposited on the wafer can be transferred to the carrying device through the wafer, so that the temperature of the carrying device increases. As a result, the process must be stopped after it has been performed for a while in order to cool down the carrying device. This operation of stopping the process to cool the device greatly affects the production cost and the capacity of the equipment.

SUMMARY OF THE INVENTION

The present disclosure aims to solve at least one of the problems existing in the prior art, and proposes a carrying device and a semiconductor processing apparatus which can not only prevent the process from being stopped due to excessively high temperature, but also maintain a uniform and stable temperature throughout the process. Therefore, it is possible to provide a stable processing temperature for the workpiece to be processed, and eventually obtain a better processing result.

To achieve an objective of the present disclosure, a carrying device is provided, the carrying device comprising a heating plate and a cooling plate, the heating plate and the cooling plate being spaced apart, and a thermal insulation region is formed between the heating plate and the cooling plate.

Optionally, the thermal insulation region is a closed space; and the heat transfer rate is adjusted by adjusting a gas pressure in the insulation region.

Optionally, the insulation region is connected to a non-atmospheric environment; or, the insulation region is connected to an atmospheric environment.

Optionally, the carrying device further comprises a thermal insulation structure, the thermal insulation structure is further disposed between the heating plate and the cooling plate to divide the thermal insulation region into at least one thermal insulation zone and at least one heat transfer zone.

Optionally, the heat transfer zone is connected to an atmospheric environment; the thermal insulation zone is connected to a non-atmospheric environment.

Optionally, a gas pressure of the thermal insulation zone is lower than a gas pressure of the heat transfer zone.

Optionally, a ratio of an orthographic projection area of the heat transfer zone on the heating plate to an orthographic projection area of the thermal insulation zone on the heating plate ranges from 0.01 to 10.

Optionally, the insulation structure comprises a ring, and a space inside the ring serves as the heat transfer zone connected to an atmospheric environment; a space outside the ring serves as the thermal insulation zone connected to a non-atmospheric environment; or, the thermal insulation structure includes a plurality of rings having different inner diameters and being mutually concentric, and the plurality of rings divide the thermal insulation region into a plurality of subspaces, any one of the subspaces serves as the thermal insulation zone or the heat transfer zone.

Optionally, the insulation structure is made from a thermal insulating material, and the thermal conductivity of the insulation structure is less than 16 W/m·K.

Optionally, the contact area of the heating plate with the insulation structure does not exceed 5% of the orthographically projection area of the heating plate on the cooling plate.

Optionally, a first protrusion is disposed on a surface of the cooling plate opposite to the thermal insulation zone; and/or A second protrusion is disposed on a surface of the heating plate opposite to the thermal insulation zone.

Optionally, an atmospheric passage is disposed on the cooling plate, and the heat transfer zone is connected to the atmospheric environment through the atmospheric passage.

Optionally, the longitudinal height of the thermal insulation region is less than or equal to 1 mm.

Optionally, a heat sink is further disposed in the cooling plate.

As another technical solution, the present disclosure also provides a semiconductor processing apparatus including a chamber and the above-described carrying device provided by the present disclosure, the carrying device being installed in the chamber.

The present disclosure has the following beneficial effects:

The present disclosure provides a carrying device that can separate a heating plate from a cooling plate by spacing the heating plate and the cooling plate apart, and by forming a thermal insulation region between the heating plate and the cooling plate, the cooling plate can dissipate excess heat generated in the process through the thermal insulation region, thereby preempting the need to stop the process due to an excessively high temperature of the heating plate, and accordingly reducing the production cost and increasing the productivity of the equipment. Meanwhile, because the heating plate and the cooling plate are spaced apart, this can avoid a large amount of heat being transferred between the heating plate and the cooling plate, so that the temperature can be maintained uniform and stable throughout the process, thereby providing a qualified and stable processing temperature for workpieces to be processed, and eventually obtaining a better processing result.

By adopting the above described carrying device, the semiconductor processing apparatus provided by the present disclosure not only can preempt the need to stop the process due to excessively high temperature, but also can maintain a uniform and stable temperature throughout the process, thereby providing a qualified and stable processing temperature for workpieces to be processed, and eventually obtaining a better processing result.

Other features and advantages of the present disclosure will become apparent by the detailed descriptions of the illustrative embodiments of the present disclosure in the following drawings.

BRIEF DESCRIPTION OF THE DRAWINGS

The accompanying drawings, which are incorporated in the detailed descriptions of the embodiments as a part, illustrate embodiments of the present disclosure, and explains the principles of the present disclosure together with the detailed descriptions of the embodiments.

The figures are labeled as follows.

Figure 1:
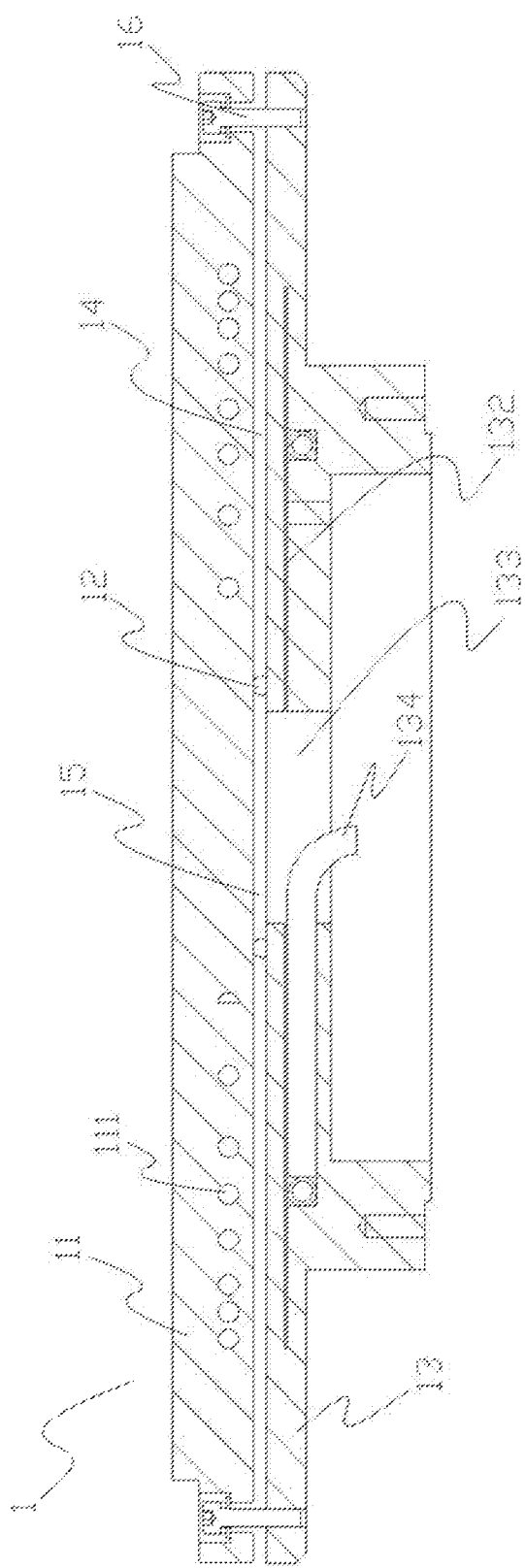
FIG. 1 is a cross-sectional diagram of a carrying device according to an embodiment of the present disclosure.

Carrying device—1, heating plate—11, heating component—111, insulation structure—12, ring—121, ring—122, cooling plate—13, first protrusion—131, heat sink—132, atmospheric passage—133, cooling pipe—134, thermal insulation region—14, heat transfer zone—15, connector—16, processing chamber—2.

DETAILED DESCRIPTION OF THE EMBODIMENTS

Various exemplary embodiments of the present disclosure are described in detail below with reference to the drawings. It should be noted that the relative arrangement of the components and steps, numerical expressions and numerical values set forth in the embodiments are not intended to limit the scope of the present disclosure unless otherwise specified.

The following descriptions of the at least one exemplary embodiment is merely illustrative and in no way limit scope of the application or use of the present disclosure.

Techniques, methods and apparatus known to those of ordinary skill in the relevant art may not be discussed in detail, but the techniques, methods and apparatus should be considered as part of the specification, where appropriate.

In all of the examples shown and discussed herein, any specific values are to be construed as illustrative only and not as a limitation. Thus, other examples of the exemplary embodiments may have different values.

It should be noted that similar reference numerals and letters indicate similar items in the following figures, and therefore, once an item is defined in one figure, it is not required to be further discussed in the subsequent figures.

As an aspect of the present disclosure, a carrying device is provided in a chamber for loading a workpiece to be processed and for heating the workpiece. The carrying device includes a heating plate and a cooling plate, the heating plate and the cooling plate are spaced apart, and a thermal insulation region is formed therebetween.

Although the heating plate and the cooling plate are spaced apart, the thermal insulation region still has certain thermal conductivity, and the cooling plate can dissipate excess heat generated in the heating plate during the process through the thermal insulation region, thereby preempting the need to stop the process due to an excessively high temperature of the heating plate, and accordingly reducing production costs and increasing capacity of the apparatus. Meanwhile, because the heating plate and the cooling plate are spaced apart, this can avoid a large amount of heat being transferred between the heating plate and the cooling plate, thereby maintaining the a uniform and stable temperature throughout the process, thereby providing a qualified and stable processing temperature for a workpiece to be processed, and eventually obtaining a better processing result.

In practical applications, the heating plate and the cooling plate can be spaced apart by any manner. In addition, in order to prevent an interior of the chamber from being connected to an atmospheric environment outside the chamber through the thermal insulation region, a corresponding insulation structure may be adopted to isolate the interior of the chamber or the thermal insulation region from an external atmosphere.

In practical applications, the above-mentioned thermal insulation region may be a closed space. For example, the thermal insulation region is a space independent of the interior of the chamber and the outside of the chamber, which can also function to transfer heat. In this situation, a heat transfer rate can be adjusted by adjusting a gas pressure in the insulation region. Specifically, the greater the gas pressure in the thermal insulation region is, the smaller the heat transfer rate is; conversely, the smaller the gas pressure in the thermal insulation region is, the greater the heat transfer rate is.

Alternatively, the thermal insulation region may be connected to a non-atmospheric environment, i.e., the interior of the chamber; or the thermal insulation region may be connected to the atmosphere. Apparently, the heat transferred between the thermal insulation region and the non-atmospheric environment is less than the heat transferred between the thermal insulation region and the atmosphere. In practical applications, the thermal insulation region can be connected to an atmospheric environment or a non-atmospheric environment according to actual needs.

The specific embodiments of the carrying device provided by the present disclosure are described in detail below. Specifically, as shown in FIG. 1, a carrying device 1 includes a heating plate 11 and a cooling plate 13, which are spaced apart, and a thermal insulation region is formed between the heating plate 11 and the cooling plate 13. The heating plate 11 can directly load the workpiece to be processed, and can also load a tray, the workpiece to be processed can be placed on the tray. The workpiece to be processed is usually a wafer or a circular wafer. Further, a heating component 111 for heating is disposed in the heating plate 11 for heating the workpiece to be processed on the heating plate 11. The heating component 111 can be any heat generating component such as a heating wire.

In the present embodiment, the carrying device 1 further includes an insulation structure 12 disposed between the heating plate 11 and the cooling plate 13 to divide the thermal insulation region into at least one thermal insulation zone 14 and at least one heat transfer zone 15. Also, the thermal insulation zone 14 transfers less heat than the heat transfer zone 15.

Because the heat transfer zone 15 can transfer more heat, it can dissipate excess heat in the heating plate 12 during the process, thereby preempting the need to stop the process due to the excessively high temperature of the heating plate, thereby reducing the cost and increasing the productivity of the apparatus. Meanwhile, since the thermal insulation zone 14 transfers less heat than the heat transfer zone 15, it can be further avoided to transfer a large amount of heat between the heating plate 11 and the cooling plate 13, so that the temperature can be maintained uniform and stable throughout the process. Accordingly, a qualified and stable processing temperature can be provided for the workpiece to be processed, and eventually a better processing result can be obtained.

In addition, the insulation structure 11 is also capable of isolating the interior of the chamber from the external atmosphere to ensure the degree of vacuum in the chamber.

Optionally, the thermal insulation zone 14 is connected to a non-atmospheric environment. The non-atmospheric environment may be, for example, an environment of the processing chamber where the carrying device 1 is located, or an environment in which the degree of vacuum is artificially set. The heat transfer zone 15 is connected to the atmosphere. The thermal insulation zone 14 is connected to the non-atmospheric environment, and the heat transfer zone 15 is connected to the atmospheric environment, causing good heat transfer effect, which is easy to implement at a low cost.

Further, optionally, an atmospheric passage 133 is disposed on the cooling plate 13, and the heat transfer zone 15 connects to the atmospheric environment through the atmospheric passage 133. The connection between the heat transfer zone 15 with the atmospheric environment through the atmospheric passage 133 causes a good heat transfer effect, which is easy to implement at a low cost.

In practical applications, the heat transfer rate of the thermal insulation zone 14 and the heat transfer rate of the heat transfer zone 15 can be controlled by controlling the gas pressure within the thermal insulation zone 14 and the gas pressure within the heat transfer zone 15, such that there is a difference in heat transfer between the two. Optionally, the gas pressure of the thermal insulation zone 14 is lower than the gas pressure of the heat transfer zone 15, such that the heat transfer rate of the heat transfer zone 15 is greater than the heat transfer rate of the thermal insulation zone 14. Preferably, the gas pressure of the thermal insulation zone 14 can be controlled to be much lower than the standard atmospheric pressure, and the gas pressure of the heat transfer zone 15 can be controlled to be the standard atmospheric pressure.

The difference between the gas pressure of the thermal insulation zone 14 and the gas pressure of the heat transfer zone 15 can be achieved by a variety of ways. For example, two pumps may be connected to the thermal insulation zone 14 and the heat transfer zone 15 respectively, the pump may be a vacuum pump or an air pump, etc. The difference between the gas pressure of the thermal insulation zone 14 and the gas pressure of the heat transfer zone 15 can be controlled by the suction of the vacuum pump or the blowing of the air pump. As another example, the thermal insulation zone 14 can be connected to the chamber where the carrying device 1 is located, and the heat transfer zone 15 can be connected to the atmosphere. Accordingly, when the carrying device 1 is in operation, the thermal insulation zone 14 has the same degree of vacuum as that in the chamber, and the gas pressure in the heat transfer zone 15 equals to the pressure of the atmospheric environment.

Optionally, the ratio of the orthographic projection area of the heat transfer zone 15 on the heating plate 11 to the orthographic projection area of the thermal insulation zone 14 on the heating plate 11 ranges from 0.01 to 10, preferably, the ratio ranges from 0.01 to 1. That is, when the orthographic projection area of the heat transfer zone 15 on the heating plate 11 is "a", and the orthographic projection area of the heat insulation zone 14 on the heating plate 11 is "b", the ratio of "a" to "b" ranges from 0.01 to 10. The range of the ratio of the orthographic projection area of the heat transfer zone 15 on the heating plate 11 to the orthographic projection area of the thermal insulation zone 14 on the heating plate 11 is selected to facilitate reasonable control of the heat transferred from the heating plate 11, to avoid too much heat dissipating from the heating plate too fast. An appropriate ratio of the orthographic projection area of the heat transfer zone 15 on the heating plate 11 to the orthographic projection area of the thermal insulation zone 14 on the heating plate 11 can be selected from the range of 0.01-10, based on the specific heating temperature requirement for the heating plate 11.

In the present embodiment, the heating plate 11, the insulation structure 12, and the cooling plate 13 are disposed sequentially from top to bottom. The insulation structure 12 is configured to support the heating plate 11 such that it is positioned above the cooling plate 13 and accordingly a space can be formed between the heating plate 11 and the cooling plate 13, wherein the insulation structure 12 can have various designs as long as the region between the heating plate 11 and the cooling plate 13 can be divided into at least one thermal insulation zone 14 and at least one heat transfer zone 15.

With respect to the structure of the insulation structure 12, it can also be flexibly selected according to actual needs. For example, the insulation structure 12 can include a ring that is easy to implement at a low cost. In specific implementation, the ring can be an O-ring.

Figure 2A:
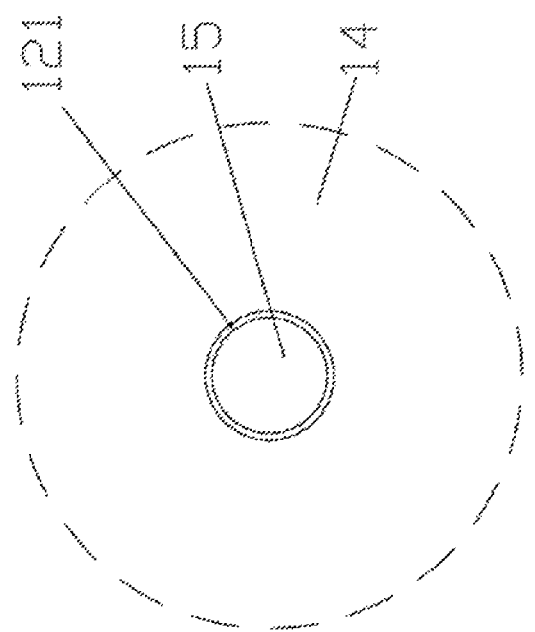
FIG. 2A is a top view diagram of an insulation structure employed in an embodiment of the present disclosure.
Figure 2B:
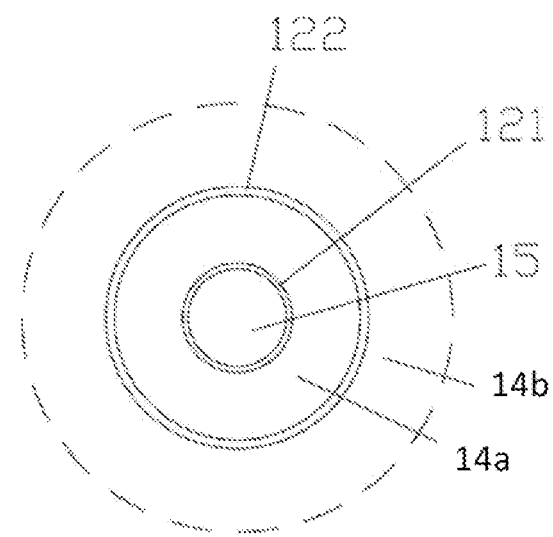
FIG. 2B is another top view diagram of an insulation structure employed in an embodiment of the present disclosure.

The ring structure may be a complete ring or may be composed of a plurality of block structures. Specifically, as shown in FIG. 2A, the insulation structure 12 may be a complete ring 121, and the space inside the ring serves as the heat transfer zone 15 and is connected to the atmospheric environment; the space outside the ring serves as the thermal insulation zone 14 and is connected to the non-atmosphere. Alternatively, as shown in FIG. 2B, the insulation structure 12 may also be two rings (121, 122) having different inner diameters and being mutually concentric, and the two rings (121, 122) divide the thermal insulation region into a plurality of subspaces, any one of the subspaces serves as the thermal insulation zone 14 or the heat transfer zone 15. For example, the central subspace serves as the heat transfer zone 15, and the remaining subspaces serves as the thermal insulation zones 14*a* and 14*b*. By selecting a different number of thermal insulation zone 14 and/or a different number of heat transfer zone 15, the heat transfer efficiency in the space divided between the heating plate 11 and the cooling plate 13 can be controlled.

Alternatively, the insulation structure 12 can also be a structure having a cavity.

In addition, the material for the insulation structure 12 can also be flexibly selected according to actual needs. For example, the insulation structure 12 is made from a ceramic material. Alternatively, the insulation structure 12 is made from a metallic material.

Optionally, the longitudinal height of the above-mentioned thermal insulation region is less than or equal to 1 mm. The longitudinal height refers to the height of the thermal insulation region in a direction perpendicular to a surface of the heating plate 11 and a surface of the cooling plate 13 which are opposite to each other. The selection of the longitudinal height of the thermal insulation region facilitates a reasonable control of the heat exchanged between the heating plate 11 and the cooling plate 13, to avoid too much heat of the heating plate 11 being carried away too fast by the cooling plate 13. Those skilled in the art can select the appropriate longitudinal height of the thermal insulation region within a range of no more than 1 mm based on the specific heating temperature requirement for the heating plate 11.

Optionally, the insulation structure 12 is made from a thermal insulating material, and the thermal conductivity of the insulation structure 12 is less than 16 W/m·K. The selection of an insulation structure 12 with a suitable thermal conductivity facilitates reducing the effect of the insulation structure 12 on the excess heat dissipation from the heating plate 11. The insulation structure 12 made from a material having a suitable thermal conductivity can be selected based on the specific heating temperature requirement for the heating plate 11.

Optionally, the contact area between the heating plate 11 and the insulation structure 12 does not exceed 5% of the orthographic projection area of the heating plate 11 on the cooling plate 13. That is, when the contact area between the heating plate 11 and the insulation structure 12 is "e", and the orthographic projection area of the heating plate 11 on the cooling plate 13 is "f", "e" is less than or equal to 5% of "f". This arrangement is more advantageous in reducing the contact area among the heating plate 11, the insulation structure 12, and the cooling plate 13, thereby reducing the effect of the contact among the three on heat dissipation from the heating plate 11. A suitable ratio of the contact area between the heating plate 11 and the insulation structure 12 to the area of the surface of the heating plate 11 opposite to the cooling plate 13 may be selected within a range of not more than 5%, based on the specific heating temperature requirement for the heating plate 11, for example, 3%.

Optionally, a first protrusion is disposed on a surface of the cooling plate 13 opposite to the thermal insulation zone 14; and/or a second protrusion is disposed on a surface of the heating plate 11 opposite to the thermal insulation zone 14. By disposing a first protrusion on the cooling plate 13, and/or a second protrusion on the heating plate 11, the size of the space of the thermal insulation zone 14 can be adjusted to further adjust the heat transfer rate in the thermal insulation zone 14. According to actual needs, only the first protrusion on the cooling plate 13, or only the second protrusion on the heating plate 11, or both the first protrusion on the cooling plate 13 and the second protrusion on the heating plate 11 can be selected.

Figure 3:
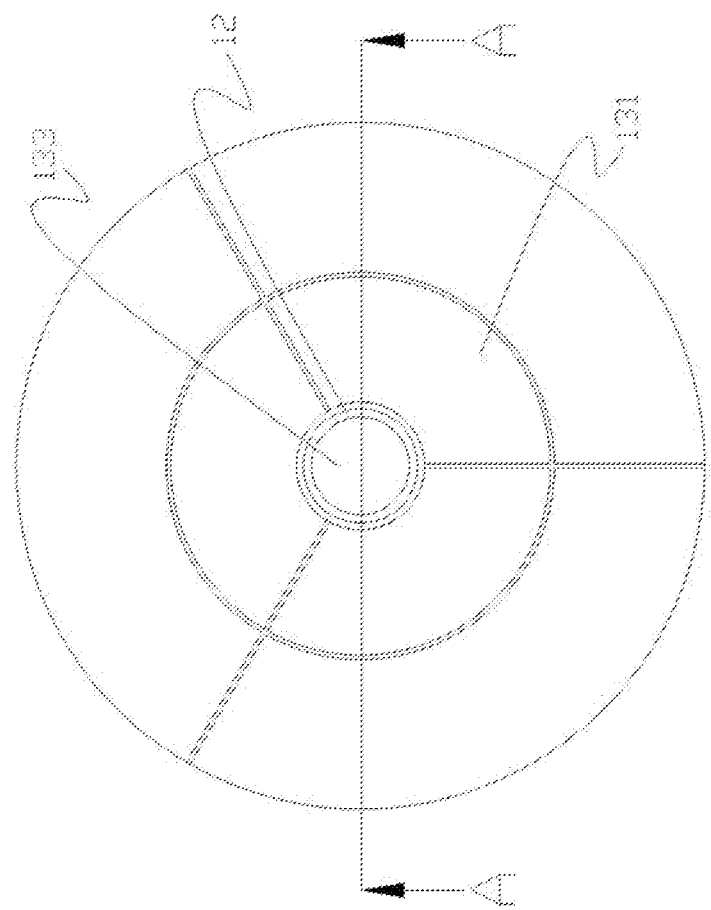
FIG. 3 is a top view diagram of a cooling plate and an insulation structure of a carrying device according to another embodiment of the present disclosure.
Figure 4:
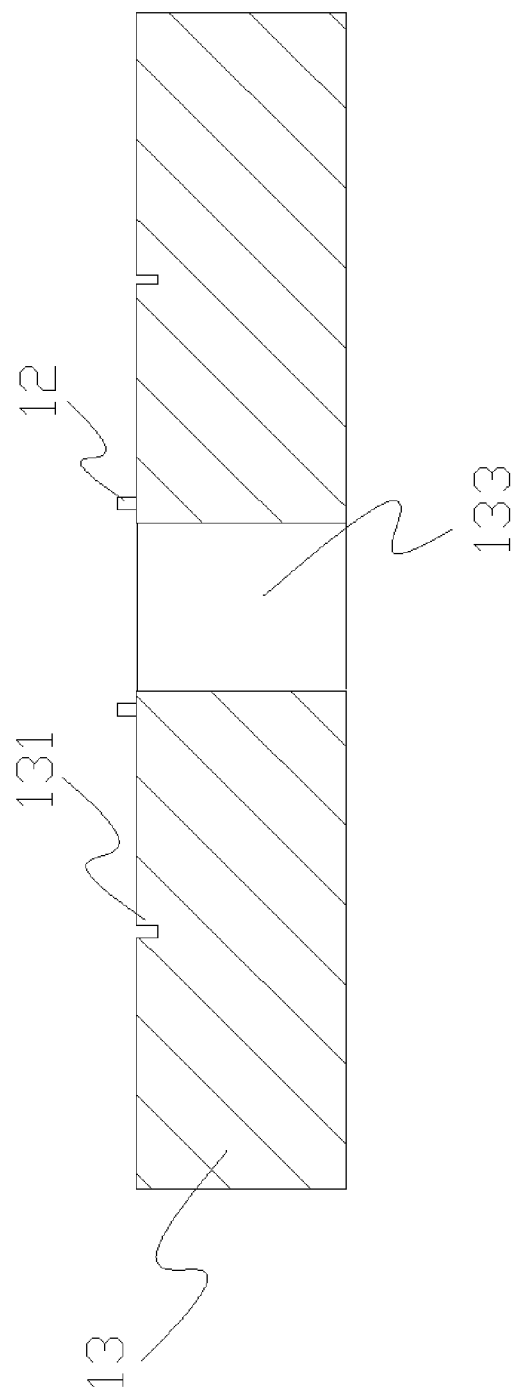
FIG. 4 is a cross-sectional diagram of FIG. 2 along an A-A direction.

For example, as shown in FIGS. 3 and 4, a first protrusion 131 is disposed on a surface of the cooling plate 13 opposite to the thermal insulation zone 14. Based on actual needs, the first protrusion 131 may constitute different figures or patterns on the surface of the cooling plate 13. By replacing the cooling plate having a first projection 131 of different heights and/or sizes, the size of the space of the thermal insulation zone 14 can be varied to further adjust the heat transfer rate in the thermal insulation zone 14.

Optionally, a heat sink 132 may be disposed in the cooling plate 13. The heat sink 132 can further improve the heat dissipation efficiency of the cooling plate 13. The material of the heat sink 132 may be aluminum or graphite.

Optionally, the carrying device 1 further includes a connector 16. The connector 16 can be configured to connect the heating plate 11 to the cooling plate 13, thereby tying the heating plate 11 and the cooling plate 13 together more reliably. The connector 16 may be disposed at an edge region of the heating plate 11 and the cooling plate 13. The connector 16 can be a hollow bolt or a pin, etc.

Figure 5:
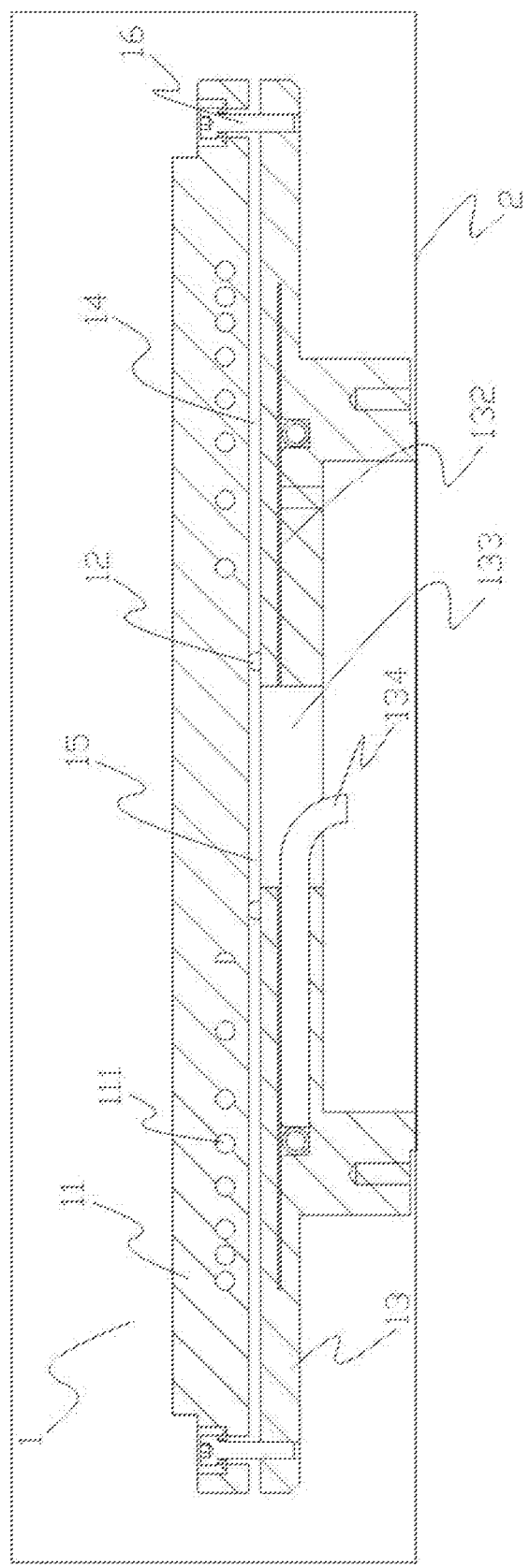
FIG. 5 is a cross-sectional diagram showing an embodiment of a semiconductor processing apparatus of the present disclosure.

Another embodiment of the present disclosure provides a semiconductor processing apparatus. As shown in FIG. 5, the semiconductor processing apparatus includes a chamber 2 and a carrying device 1 provided by the present disclosure, the carrying device 1 is installed in the chamber 2.

The semiconductor processing apparatus of the present disclosure can not only prevent the process from being stopped due to excessively high temperature by using the above-mentioned carrying device 1, but also maintain a uniform and stable temperature throughout the process, thereby providing a qualified and stable processing temperature for the workpiece to be processed, and eventually obtaining a better processing result.

Optionally, the chamber 2 is a vacuum chamber. Further, the carrying device 1 includes a heating plate 11 and a cooling plate 13, which are spaced apart from each other, and a thermal insulation region is formed between the heating plate 11 and the cooling plate 13. At the same time, the carrying device 1 further includes an insulation structure 12, disposed between the heating plate 11 and the cooling plate 13, to divide the thermal insulation region into at least one thermal insulation zone 14 and at least one heat transfer zone 15. Also, the thermal insulation zone 14 transfers less heat than the heat transfer zone 15.

Under this circumstance, optionally, the thermal insulation zone 14 is connected to the chamber 2; that is, the degree of vacuum in the thermal insulation zone 14 is the same as the degree of vacuum in the chamber 2. The heat transfer zone 15 is connected to the external environment of the chamber 2. The external environment of the chamber 2 is usually an atmospheric environment. The heat transfer zone 15 can be connected to the external environment of the chamber 2 through a structure such as a connecting pipe.

A heating component 111 for heating may be disposed in the heating plate 11. Specifically, the heating component 111 can be a heating wire. A cooling pipe 134 is disposed in the cooling plate 13, and the cooling pipe 134 is used for the flow of a cooling medium. Usually, a cooling pipe can be disposed in the semiconductor processing apparatus and be connected to the cooling pipe 134, to transport the cooling medium into or from the cooling pipe 134. The above cooling medium may be, for example, cooling water, etc.

The semiconductor processing apparatus can be a magnetron sputtering deposition apparatus.

In a magnetron sputtering deposition apparatus, a target is disposed. During the sputtering process, a DC power source (direct current source) may apply a bias voltage to the target, to make a negative voltage with respect to the grounded chamber 2, and argon gas discharge in a vacuum environment and a plasma is generated; and the negative bias voltage can simultaneously attract the positively charged argon ions to the target. When the energy of the argon ions is sufficiently high and blasts the target under the magnetic field formed by the magnetron, the metal atoms escape the surface of the target and are deposited on a workpiece to be processed on the carrying device 1 by diffusion.

While the present disclosure has been described in detail with reference to the preferred embodiments of the present disclosure, it is understood that it will be appreciated by those skilled in the art that the above embodiments may be modified without departing from the scope and spirit of the present disclosure. The scope of the present disclosure is defined by the appended claims.

What is claimed is:

1. A carrying device comprising:
a heating plate;
a cooling plate spaced apart from the heating plate;
a thermal insulation structure located between the heating plate and the cooling plate, and configured to support the heating plate to cause the heating plate to be positioned above the cooling plate, the thermal insulation structure including a first O-ring and a second O-ring, the first O-ring and the second O-ring having different inner diameters and being mutually concentric, the first O-ring dividing an unoccupied space between the heating plate and the cooling plate into a first thermal insulation space that is outside the first O-ring and a heat transfer space that is inside the first O-ring, and the second O-ring dividing the first thermal insulation space into a second thermal insulation space that is between the first O-ring and the second O-ring, and a third thermal insulation space that is outside the second O-ring;
an atmospheric passage penetrating a center of the cooling plate from a bottom surface of the cooling plate to a top surface of the cooling plate, and connected to the heat transfer space;
a cooling pipe disposed in the cooling plate, passing through the atmospheric passage, and configured to transport a cooling liquid; and
a heat sink disposed in the cooling plate, the atmospheric passage penetrating a center of the heat sink, a material of the heat sink being graphite, and the cooling pipe being disposed under the heat sink and in contact with the heat sink;
wherein:
the heat transfer space is connected to an atmospheric environment through the atmospheric passage; and
the first thermal insulation space is connected to a non-atmospheric environment.

2. The carrying device according to claim 1, wherein the thermal insulation structure is made from a thermal insulating material, and a thermal conductivity of the insulation structure is less than 16 W/m·K.

3. The carrying device according to claim 1, wherein a contact area between the heating plate and the thermal insulation structure is less than or equal to 5% of an orthographic projection area of the heating plate on the cooling plate.

4. The carrying device according to claim 1, further comprising:
a first protrusion disposed on a surface of the cooling plate in the first thermal insulation space; and/or
a second protrusion disposed on a surface of the heating plate in the first thermal insulation space.

5. The carrying device according to claim 1, wherein a gap distance between the heating plate and the cooling plate is less than or equal to 1 mm.

6. The carrying device according to claim 1, wherein an orthographic projection of the heat sink disposed on the cooling plate has no overlap with the orthographic projection area of the heat transfer space on the heating plate.

7. The carrying device according to claim 1, wherein the first O-ring and the second O-ring are made of a metallic material.

8. The carrying device according to claim 1, wherein the heat transfer space includes an entire cylindrical space inside the first O-ring.

9. The carrying device according to claim 1, wherein the heat transfer space is filled with air only.

10. The carrying device according to claim 1, wherein the atmospheric passage is only disposed in the cooling plate.

11. A semiconductor processing apparatus, comprising:
a chamber; and
a carrying device installed within the chamber, the carrying device comprising:
a heating plate;
a cooling plate spaced apart from the heating plate;
a thermal insulation structure located between the heating plate and the cooling plate, and configured to support the heating plate to cause the heating plate to be positioned above the cooling plate, the thermal insulation structure including a first O-ring and a second O-ring, the first O-ring and the second O-ring having different inner diameters and being mutually concentric, the first O-ring dividing an unoccupied space between the heating plate and the cooling plate into a first thermal insulation space that is outside the first O-ring and a heat transfer space that is inside the first O-ring, and the second O-ring dividing the first thermal insulation space into a second thermal insulation space that is between the first O-ring and the second O-ring, and a third thermal insulation space that is outside the second O-ring;
an atmospheric passage penetrating a center of the cooling plate from a bottom surface of the cooling plate to a top surface of the cooling plate, and connected to the heat transfer space;
a cooling pipe disposed in the cooling plate, passing through the atmospheric passage, and configured to transport a cooling liquid; and
a heat sink disposed in the cooling plate, the atmospheric passage penetrating a center of the heat sink, a material of the heat sink being graphite, and the cooling pipe being disposed under the heat sink and in contact with the heat sink;
wherein:
the heat transfer space is connected to an atmospheric environment through the atmospheric passage; and
the first thermal insulation space is connected to a non-atmospheric environment.

12. The semiconductor processing apparatus according to claim 11, wherein:
the chamber is a vacuum chamber;
the third thermal insulation space is connected to the chamber; and
the heat transfer space is connected to the atmospheric environment outside the chamber.

* * * * *